(12) United States Patent
Deak (10) Patent No.: US 10,126,378 B2
(45) Date of Patent: Nov. 13, 2018

(54) SINGLE-CHIP Z-AXIS LINEAR MAGNETIC RESISTANCE SENSOR

(71) Applicant: MultiDimension Technology Co., Ltd., Zhangjiagang (CN)

(72) Inventor: James Geza Deak, Zhangjiagang (CN)

(73) Assignee: MULTIDIMENSION TECHNOLOGY CO., LTD, Zhangjiagang, Jiangsu (CN)

( * ) Notice: Subject to any disclaimer, the term of this patent is extended or adjusted under 35 U.S.C. 154(b) by 103 days.

(21) Appl. No.: 14/917,784

(22) PCT Filed: Sep. 10, 2014

(86) PCT No.: PCT/CN2014/086231
§ 371 (c)(1),
(2) Date: Mar. 9, 2016

(87) PCT Pub. No.: WO2015/035912
PCT Pub. Date: Mar. 19, 2015

(65) Prior Publication Data
US 2016/0223623 A1 Aug. 4, 2016

(30) Foreign Application Priority Data

Sep. 10, 2013 (CN) .......................... 2013 1 0409446

(51) Int. Cl.
*G01R 33/09* (2006.01)
*H01L 27/22* (2006.01)
(Continued)

(52) U.S. Cl.
CPC ........... *G01R 33/091* (2013.01); *G01R 33/09* (2013.01); *H01L 27/22* (2013.01); *H01L 43/02* (2013.01); *H01L 43/08* (2013.01)

(58) Field of Classification Search
CPC ............................. G01R 33/09; G01R 33/093
See application file for complete search history.

(56) References Cited

U.S. PATENT DOCUMENTS

2009/0309590 A1* 12/2009 Kataoka ............. G01R 33/0011
324/244
2012/0200292 A1* 8/2012 Sugihara ................ B82Y 25/00
324/252
(Continued)

FOREIGN PATENT DOCUMENTS

CN 102636762 8/2012
CN 103267520 8/2013
(Continued)

OTHER PUBLICATIONS

"International Application No. PCT/CN2014/086231, International Search Report and Written Opinion dated Oct. 28, 2014", (Oct. 28, 2014), 12 pgs.

*Primary Examiner* — Noam Reisner
(74) *Attorney, Agent, or Firm* — Schwegman Lundberg & Woessner, P.A.

(57) ABSTRACT

A single-chip Z-axis linear magnetoresistive sensor is provided. The sensor comprises a substrate, magnetoresistive sensing elements, and flux guides, wherein the magnetoresistive sensing elements are mutually electrically connected to form push arms and pull arms of a bridge; the push arms and the pull arms are alternately arranged, and the magnetoresistive sensing elements on the push arms and the pull arms are respectively located at two sides beneath the flux guides; the magnetization direction of a pinning layer of each magnetoresistive sensing element is the same and is in an X-axis direction. An external magnetic field in a Z-axis direction is converted into a magnetic field with components in an X-axis direction by the flux guides, and thus the magnetoresistive sensing elements beneath the flux guides can detect this component. The sensor has the advantages of the small size, simple manufacturing, simple packaging, high sensitivity, good linearity, wide operating range, low (Continued)

offset, good temperature compensation, and capability to measure high magnetic fields, etc.

18 Claims, 4 Drawing Sheets

(51) Int. Cl.
*H01L 43/02* (2006.01)
*H01L 43/08* (2006.01)

(56) References Cited

U.S. PATENT DOCUMENTS

| | | | | |
|---|---|---|---|---|
| 2013/0082697 A1* | 4/2013 | Fu | ............... | G01R 33/096 |
| | | | | 324/252 |
| 2013/0168787 A1 | 7/2013 | Shen | | |
| 2014/0320124 A1* | 10/2014 | David | ............ | G01R 33/093 |
| | | | | 324/252 |

FOREIGN PATENT DOCUMENTS

| | | |
|---|---|---|
| CN | 103267955 | 8/2013 |
| CN | 203480009 | 3/2014 |
| CN | 103901363 | 7/2014 |
| EP | 2639594 | 9/2013 |
| JP | 2012127788 | 7/2012 |
| WO | WO-2015/035912 | 3/2015 |

\* cited by examiner

SINGLE-CHIP Z-AXIS LINEAR MAGNETIC RESISTANCE SENSOR

PRIORITY CLAIM TO RELATED APPLICATIONS

This application is a U.S. national stage application filed under 35 U.S.C. § 371 from International Application Serial No. PCT/CN2014/086231, which was filed 10 Sep. 2014, and published as WO2015/035912 on 19 Mar. 2015, and which claims priority to Chinese Application No. 201310409446.5, filed 10 Sep. 2013, which applications and publication are incorporated by reference as if reproduced herein and made a part hereof in their entirety, and the benefit of priority of each of which is claimed herein.

Technical Field

The present invention relates to the field of sensor technology, and in particular, to a single-chip Z-axis linear magnetoresistive sensor.

Background Art

As magnetoresistive sensor technology has, the applications of magnetoresitive sensors have become more extensive. Currently, magnetic sensors are widely used in cell phones and other mobile devices as electronic compass, and the market of such products is very sensitive to the cost and packaging size. For a two-dimensional magnetic field in an X-Y plane, measurement of the X and Y components of the magnetic field within the plane may be implemented by using two orthogonal sensors, but for the measurement on the magnetic field in a Z-axis direction there are many difficulties, as such, the following solutions are typically utilized:

(1) A separate single-axis planar magnetoresistive sensor is installed perpendicular to a two-axis planar sensor, but this manner has the following disadvantages:

1. the X-Y two-axis magnetoresistive sensor and the Z-axis magnetoresistive sensor are respectively separate elements before being installed, that is, the sensors are not integrated onto a single die before packaging, and therefor a complex manufacturing manufacturing process is required;

2. as compared with an integrated manufacturing process, each sensor in the three-axis magnetoresistive sensor system assembled from separate sensor chips has worse alignment accuracy, thereby affecting the measurement accuracy of the sensor; and 3. because the Z-axis magnetoresistive sensor is perpendicular to the X-Y two-axis magnetoresistive sensor, the size of the package of the assembled three-axis magnetoresistive sensor in the Z-direction is increased, thereby increasing the device size and difficulty in packaging.

(2) A flux guide has previously been used in the art to convert a magnetic field from the Z-axis direction into magnetic field components in the X- and Y-axis directions. For example, Chinese Patent Application No. 201110098286.8 discloses a single-chip three-axis AMR sensor, which implements measurement of a magnetic field in the Z-axis direction by placing a flux guide above in-plane sensors. However, the flux guide does not completely cover all the in-plane sensors, such that the magnetic field in the Z-axis direction is not fully converted into theX- and Y-axis directions. In addition, the sensor design disclosed in that application does not permit the in-plane sensors to be densely packed in order to reduce noise, and it is also difficult to control temperature compensation and offsets thereof. In addition, Chinese Patent Application No. 201310202801.1 discloses a three-axis digital compass, which converts the Z-axis magnetic field component perpendicular to a plane by the distorting effects of a flux guide into a magnetic field component in the X-Y plane, and then separates the X-, Y-, and Z-axis magnetic field components of the external magnetic field by using a certain algorithm, and then converts the calculated components into a digital signal output. This design needs to use a specific algorithm for calculating the magnetic field in the Z-axis direction, which makes the sensor design more complicated, and since the design utilizes a referenced bridge structure, and the resulting sensor has an asymmetric output characteristic, offsets in the output of the sensor are generated.

(3) A substrate is micro-machined to form an inclined plane, onto which a sensor that partially senses the magnetic field in the Z-axis direction is deposited. Such a process is very complicated, has a low spatial efficiency, and may cause some shadowing effects in the deposition of the sensor, which may degrade the performance of the sensor.

(4) The magnetic field in the Z-axis direction is measured utilizing magnetic materials with perpendicular magnetic anisotropy. For example, US Patent Application US20130168787A1 discloses a magnetic sensor, which measures a Z-axis component of an external magnetic field by using a perpendicular magnetic anisotropy material, but the perpendicular magnetic anisotropy material has a high coercivity, and also low magnetoresistance.

SUMMARY OF THE INVENTION

The objective of the present invention is to overcome the above problems existing in the prior art, and provide a single-chip Z-axis linear magnetoresistive sensor having small volume, low cost, high sensitivity, good linearity, manufacturing simple manufacturing process, and a capability to measure large magnetic fields.

In order to achieve the above technical objective, the present invention may be realized through the following technical solutions:

A single-chip Z-axis linear magnetoresistive sensor, the sensor includes:

a substrate onto which a bridge is deposited;

the bridge is constructed by alternately arranged push arms and pull arms which are electrically connected to each other;

the push arms and pull arms respectively containing at least one magnetoresistive sensing element each which electrically connected to each other, for detecting components of a magnetic field in an X-axis direction;

a set of fluxguides comprising at least one flux guide, the set of all the flux guides covering the entire bridge; and a long axis of the flux guides being parallel to a Y axis, and a short axis of the flux guides being parallel to an X axis.

Preferably, the magnetoresistive sensing elements are GMR or TMR sensing elements, and pinning layers of the GMR or the TMR sensing elements have the same magnetization direction.

Preferably, a ratio between length and width of the magnetoresistive sensing elements is greater than 1.

Preferably, when no external magnetic field is provided, the magnetization direction of a ferromagnetic free layer of the magnetoresistive sensing elements is parallel to the Y axis, and the magnetization direction of the pinning layer is parallel to the X axis.

Preferably, the magnetoresistive sensing elements have a ferromagnetic free layer with a magnetization direction aligned parallel to the Y axis through the use of permanent magnet bias, double exchange bias, shape anisotropy, or a combination of at least two of permanent magnet bias, double exchange bias, or shape anisotropy.

Preferably, the magnetization direction of the pinning layer is set parallel to the X axis, and the magnetization direction of the ferromagnetic free layer is aligned in the direction parallel to the Y axis, by shape anisotropy, where the ratio between length and width of the magnetoresistive sensing elements is greater than 3.

Preferably, the push arms and the pull arms have the same number have the same number of magnetoresistive elements, and the long axis of the magnetoresistive sensing elements is parallel to the Y axis.

Preferably, the bridge is a half bridge, a full bridge, or a quasi bridge.

Preferably, the flux guides are have a length Ly that is greater than a width Lx, and is also greater than a thickness Lz, and the flux guides are arranged in an array such that the space S between two adjacent flux guides is not less than the width Lx. The material of the flux guides is a soft ferromagnetic alloy, which contains one or several elements of Ni, Fe, Co, or Al.

Preferably, the space S between the adjacent two flux guides ranges from 2Lx to 3Lx.

Preferably, the bridge is connected to a semiconductor packaging lead frame via a wire bond, and encapsulated in plastic to form a standard semiconductor package.

Preferably, the semiconductor packaging method includes wire bonding, flip chip, ball grid array (BGA) packaging, wafer level packaging (WLP), or chip on board (COB) packaging.

Preferably, the substrate includes an integrated circuit electrically connected to the bridge.

Preferably, the magnetoresistive sensing elements are located at any position between the lower edge of the flux guides and the center of the flux guides.

Preferably, the magnetoresistive sensing elements are located at two sides outside of the lower part with respect to the edge of the flux guides.

Preferably, the magnetoresistive sensing elements are located at any position between ⅓ and ⅔ of the distance from the edge to the central line of the flux guides, including the ⅓ and ⅔ points.

Preferably, the magnetoresistive sensing elements are moved to approach the lower edge of the flux guides, or the thickness Lz of the flux guides is increased, or the width Lx of the flux guides is reduced, so as to enhance the sensitivity of the single-chip Z-axis linear magnetoresistive sensor.

As compared with the prior art, the present application has the following beneficial effects:

(1) a plurality of flux guides with an elongated strip shape are adopted, to enable the sensor to have low hysteresis, good linearity, and high sensitivity, and also to enable the output of the sensor to saturate at high field, thereby increasing the dynamic range of the operation of the sensor;

(2) all the magnetoresistive sensing elements are located beneath the flux guides, which facilitates shielding of the in-plane magnetic field components, and the required magnetic field in the Z-axis direction is directly detected without using an algorithmic approach;

(3) the operating magnetic field of the single-chip Z-axis linear magnetoresistive sensor of the present invention can exceed 200 Gauss;

(4) The single-chip Z-axis linear magnetoresistive sensor of the present invention does not need sloped substrates or tilted chip packaging, it is simple to manufacture, easy packaging process, and it is compatible with fully integrated manufacturing.

DESCRIPTION OF THE DRAWINGS

To describe the technical solutions and techniques of the embodiments of the present invention more clearly, the following briefly introduces the accompanying drawings required for describing the preferred embodiments. Obviously, the drawings in the following description do not list all possible embodiments of the present invention, and a person of ordinary skill in the art may derive other drawings from these drawings without creative efforts.

DETAILED DESCRIPTION OF THE EMBODIMENTS

Hereinafter, the present invention is illustrated in detail with reference to the drawings in combination with its embodiments.

Embodiments

Figure 1:
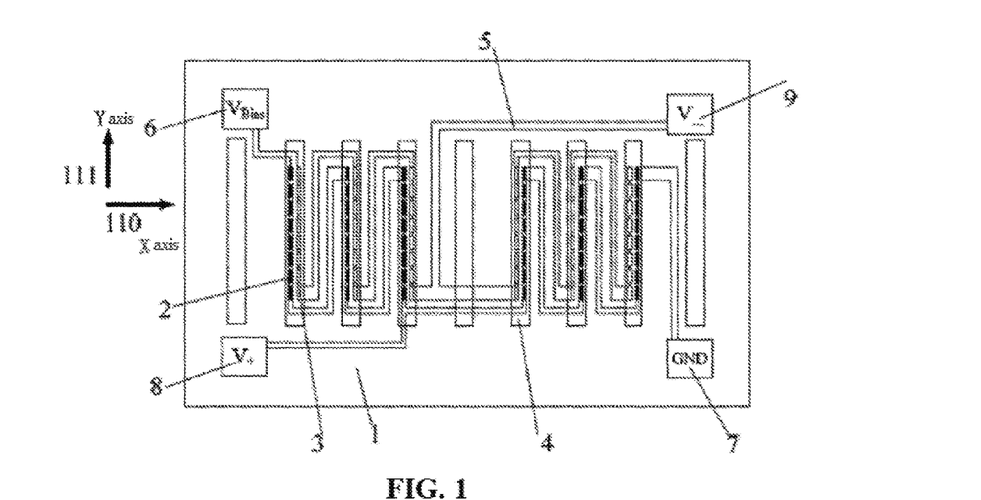
FIG. 1 is a schematic structural view of a single-chip Z-axis linear magnetoresistive sensor of the present invention.

FIG. 1 is a schematic structural view of a single-chip Z-axis linear magnetoresistive sensor of the present invention. It can be seen from FIG. 1 that, the sensor includes a substrate 1, a plurality of magnetoresistive sensing elements 2 and 3, a plurality of flux guides 4, electrically connected conductors 5, and solder pads 6-9. The solder pads 6-9 respectively serve as a power supply terminal $V_{Bias}$, a ground terminal GND, and voltage output terminals V+ and V−. The magnetoresistive sensing elements 2 and 3 are respectively located on two sides of the long axis beneath the flux guides 4, and the flux guides 4 can cover all the magnetoresistive sensing elements completely. Of course, the magnetoresistive sensing elements 2 and 3 can also be respectively located outside of the edges on two sides of the long axis beneath the flux guides 4. In this embodiment, although the magnetoresistive sensing elements are not placed beneath the three flux guides at the outermost of the left and right sides and in the center, but if necessary, the magnetoresistive sensing elements can be placed beneath all the flux guides. All the magnetoresistive sensing elements 2 are mutually electrically connected to form the push arms of a bridge, all the magnetoresistive sensing elements 3 are mutually electrically connected to form the pull arms of the bridge, the push arms and the pull arms are arranged at intervals, the push arms, the pull arms, and the solder pads 6-9 are connected through the electrically connected conductors 5 to form the bridge. In one possible embodiment, when the magnetoresistive sensing elements are along a short axis direction, i.e., the X-axis direction, of the flux guides, and are located at any position between the lower edge of the flux guides to the center of the flux guides, including the center, the linear operating range of the single-chip Z-axis linear magnetoresistive sensor can be increased.

The magnetoresistive sensing elements 2 and 3 may be GMR or TMR sensing elements, and in this embodiment, the TMR sensing elements are adopted. The magnetoresistive sensing elements 2 and 3 may be in the shape of a square, a diamond, or an ellipse, but are not limited to the above shapes, the ratio of length to width is greater than 1, and in this example, the length is 15 microns, and the width is 1.5 microns. The magnetoresistive sensing elements 2 and 3 have the same number, the direction of the long axis thereof is parallel to the Y axis, and the pinning layers of these magnetoresistive sensing elements have the same magnetization direction, namely 110. When no external magnetic field is provided, the magnetoresistive sensing elements 2 and 3 enable the magnetization direction 111 of a ferromagnetic free layer to be parallel to the Y axis, and the magnetization direction 110 of the pinning layer to be parallel to the X axis, by permanent magnet bias, double exchange interaction, shape anisotropy, or any combination thereof. The magnetization directions 110 and 111 are perpendicular to each other, for detecting a difference between components in the X-axis direction of the external magnetic field in the Z-axis direction. When it is selected that the magnetization direction of the ferromagnetic free layer is enabled to be perpendicular to the magnetization direction of the pinning layer by the shape anisotropy, the ratios between length and width of the magnetoresistive sensing elements 2,3 are all greater than 3.

The flux guides 4 are a rectangular array, but are not limited to the above shape. Their length Ly is greater than the width Lx, and is also greater than the thickness Lz, the space S between the adjacent two flux guides is not less than the width Lx, and preferably, the value of the space S is 2Lx to 3Lx. Their constituent material is a soft ferromagnetic alloy composed of one or several elements selected from the group consisting of Ni, Fe, Co, and Al, but is not limited to the above materials. Preferably, the width Lx is 1-20 microns, the length Ly is 10-1000 microns, the thickness Lz is 1-20 microns, and the space S between the adjacent two flux guides is 1-60 microns.

In this embodiment, the solder pads are adopted to achieve input and output connections and the electrical connection between the sensor chip and a package leading-out end, and other semiconductor packaging methods can also be used, including flip chip, ball grid array packaging, wafer level packaging, and chip on board packaging. Moreover, an integrated circuit electrically connected to the bridge may be further embodied on the substrate 1.

Figure 2:
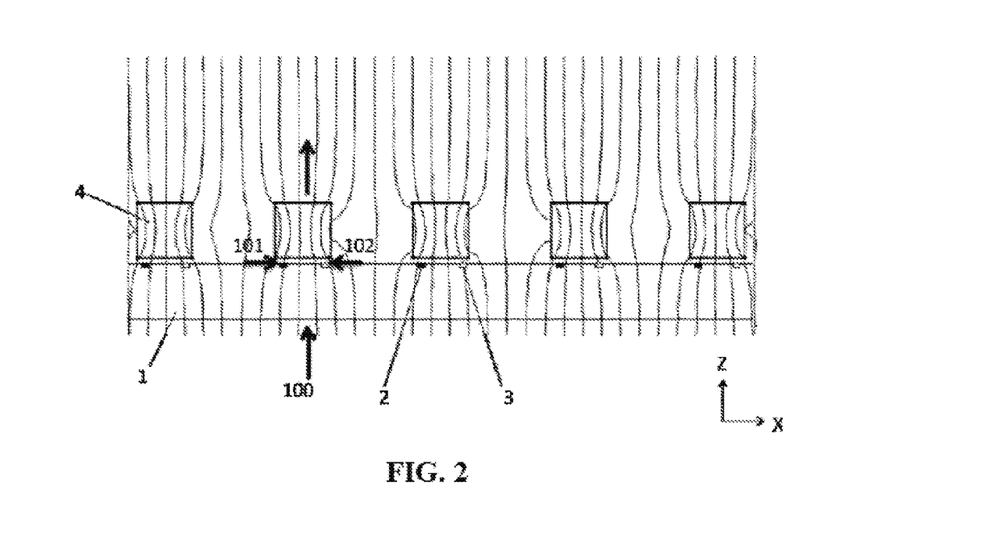
FIG. 2 is a cross-sectional view of a magnetic field in a Z-axis direction distributed surrounding flux guides.

FIG. 2 is a cross-sectional view of an external magnetic field 100 in the Z-axis direction distributed surrounding the flux guides 4. It can be seen from the distribution situation of magnetic field lines in the figure that, a distortion of the external magnetic field is generated in the vicinity of the flux guides 4, so as to generate a magnetic field component in the X-axis direction, and the magnetoresistive sensing elements 2 and 3 located beneath the flux guides 4 can justly detect this component, but the magnetic field components detected by the magnetoresistive sensing elements 2 and 3 are in the opposite direction, namely 101 and 102 respectively. Through the detected magnetic field component in the X axis, the magnitude of the applied external magnetic field can be known. Because the magnitude of the magnetic field intensity of the external magnetic field passing through the flux guides 4 may be attenuated greatly, even if an external magnetic field having a high intensity (for example, 200 Gauss) is applied, as long as it is in the range of the operating magnetic field of the sensor, the sensor can work normally.

The ideal location for the magnetoresistive sensing elements depends on an expected application. Specifically, the sensitivity of the sensor provided in the present invention mainly depends on the following several factors: the width Lx, the thickness Lz, and the length Ly of the flux guides 4 and a distance $L_{edge}$ between the magnetoresistive sensing elements 2 and 3 and the lower edge of the flux guides 4. When the magnetoresistive sensing elements 2 and 3 are away from the edge of the flux guides 4 or get close to the center of the flux guides 4, the sensitivity of the sensor will be reduced, but the saturated magnetic field of the sensor will be increased, for example, at this moment, the sensor can work normally in the magnetic field above 500 Gauss. When the magnetoresistive sensing elements 2 and 3 get closer to the lower edge of the flux guides 4, or the thickness Lz of the flux guides 4 is increased or the width Lx is reduced, the sensitivity of the sensor can be enhanced. The sensor provided in the present invention can be easily applied in various applications without modifying the whole photolithographic mask set.

Figure 3:
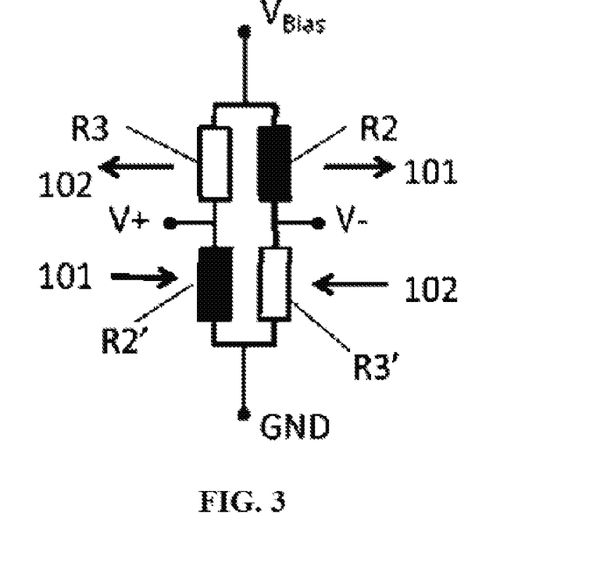
FIG. 3 is a schematic circuit diagram of the single-chip Z-axis linear magnetoresistive sensor of the present invention.

FIG. 3 is a schematic circuit principle diagram corresponding to FIG. 2. Several magnetoresistive sensing elements 2 are electrically connected with each other to form equivalent magnetoresistive sensing arms R2 and R2', the several magnetoresistive sensing elements 3 are electrically connected with each other to form two equivalent magnetoresistive R3 and R3', and the four sensing arms are connected to form a full bridge. When the external magnetic field in the Z-axis direction is applied, the resistance change of the magnetoresistive sensing arms R2, R2' and R3, R3' is in the contrary situation, thus forming a push-pull output. In general, R2'=R2, and R3'=R3. It can be obtained from FIG. 3 that, an output voltage of the circuit is:

$$V_{out} = V_+ - V_- = \frac{R2 - R3}{R2 + R3} V_{Bias}$$

Figure 4:
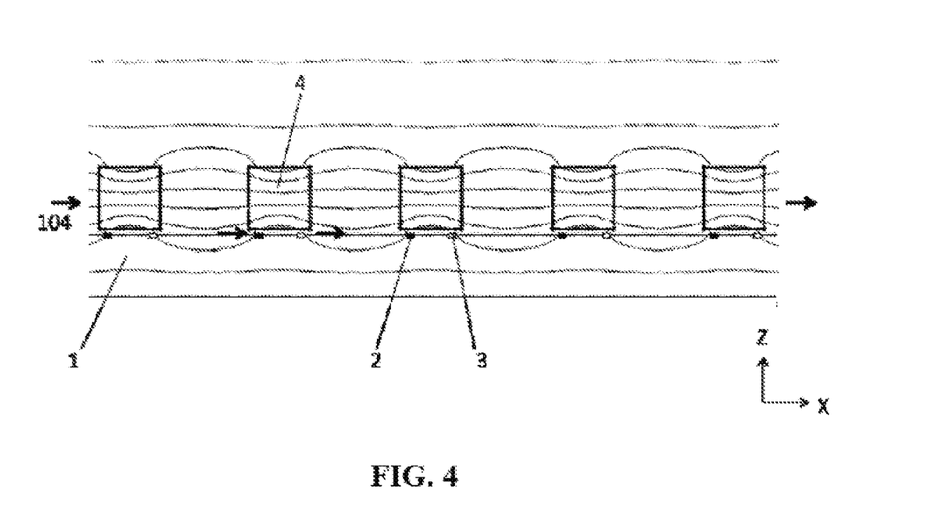
FIG. 4 is a cross-sectional view of the X-axis magnetic field distribution surrounding the flux guides.

FIG. 4 is a cross-sectional view of an external magnetic field 104 in the X-axis direction distributed surrounding the flux guides 4. It can be seen from the figure that, the magnetoresistive sensing elements 2 and 3 detect the same magnetic field, which may cause that the resistance change of the magnetoresistive sensing arms R2, R2' and R3, R3' is in the same situation, thus failing to form the push-pull output, so that the sensor will not generate a response. In terms of explanation on the structure of the sensor itself, the push arms and the pull arms are arranged at intervals, which make the bridge to play a role of a very good balance gradiometer, such that the sensor makes no response on the crossed magnetic field in the X-axis direction.

Figure 5:
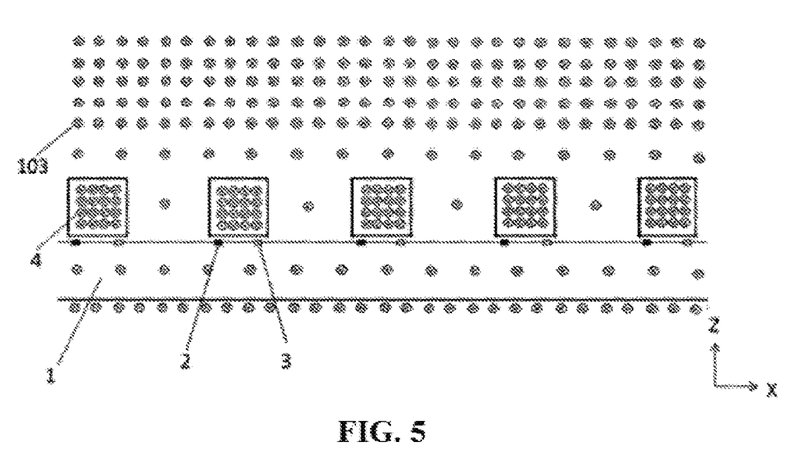
FIG. 5 is a cross-sectional view of the Y-axis magnetic field distribution surrounding the flux guides.

FIG. 5 is a cross-sectional view of an external magnetic field 103 in the Y-axis direction distributed surrounding the flux guides 4. It can be seen from the figure that, the flux guides 4 completely shield the external magnetic field in the Y-axis direction and the magnetoresistive sensing elements are not sensitive to the magnetic field in the Y-axis direction, so that the magnetoresistive sensing elements do not detect any magnetic field component, and thus the sensor will not make any response.

Figure 6:
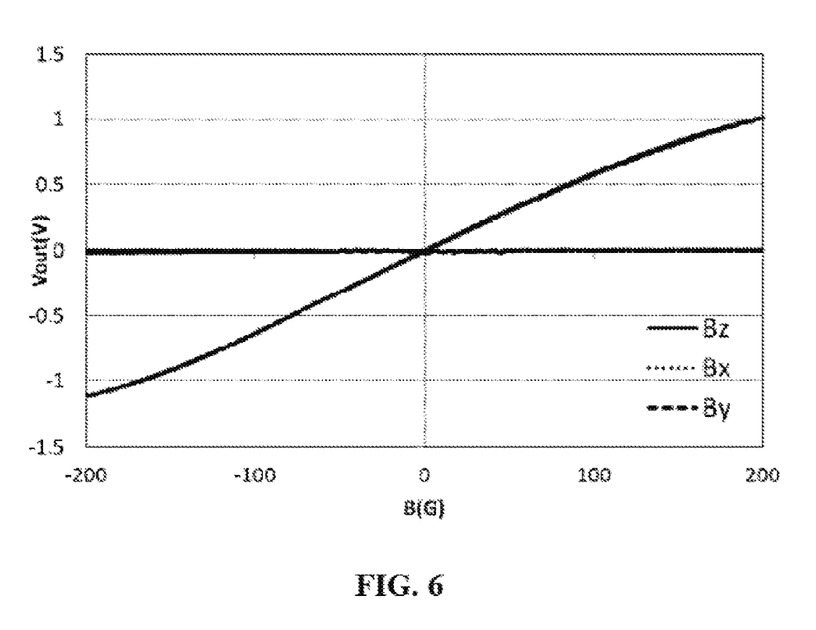
FIG. 6 shows a transfer curve of the output voltage of the sensor versus the magnetic field in X-, Y-, and Z-axis directions.

FIG. 6 is a relation curve of an output voltage of the sensor versus the magnetic field in X-, Y-, and Z-axis directions. The data on the curve in the figure is real-measured data. It can be seen from FIG. 6 that, when the magnetic fields in the X- and Y-axis directions are applied, the output voltage of the sensor is 0, which is consistent with the conclusion obtained in FIG. 4 and FIG. 5. When the magnetic field in the Z-axis direction is applied, in the range of the magnetic field of −200 to 200 Gauss, the output voltage generated by the sensor is approximately in a linear relationship with the magnitude of the external magnetic field, so it can be seen that the linearity of the sensor is very good.

Figure 7:
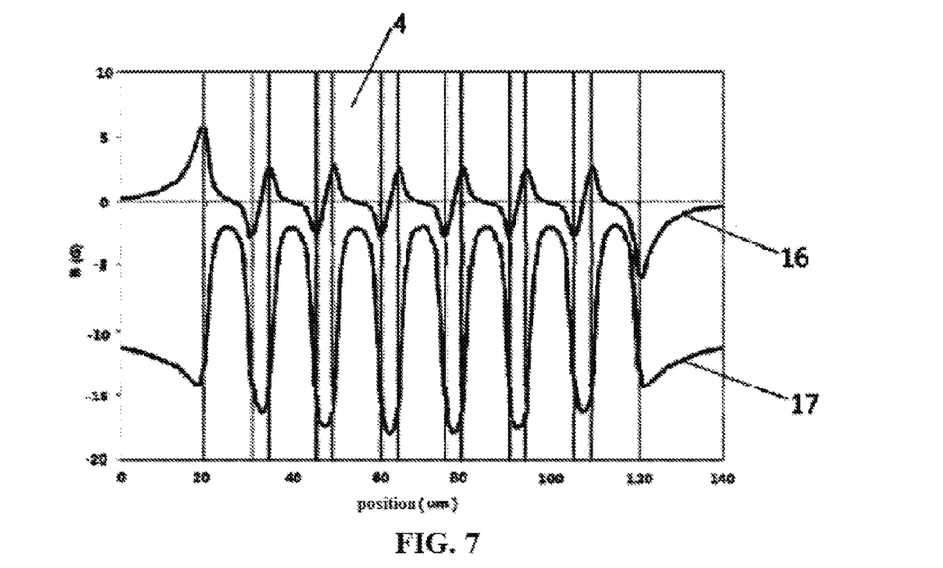
FIG. 7 shows curves of the measured magnetic field components in the X- and Z-axis directions versus the positions of magnetoresistive sensing elements when the space between two adjacent flux guides is 5 microns.

FIG. 7 show relation curves of the detected magnetic field components in the X- and Z-axis directions versus the positions of magnetoresistive sensing elements when the space between the adjacent two flux guides is 5 microns. The magnitudes of the applied external magnetic fields are all 10 Gauss, the curve 16 is a relation curve of the external magnetic field in the Z-axis direction versus the position of the magnetoresistive sensing elements. It can be viewed from the curve 16 that, the external magnetic field entering the flux guides will be significantly attenuated, and the magnetic fields detected by the magnetoresistive elements 2 and 3 beneath the flux guides are respectively $B_{x+}$=2.5 G, $B_{x-}$=2.5 G, and thus a gain coefficient $Axz=Bx/Bz=(B_{x+}-B_{x-})/Bz=0.5$ is obtained, the curve 17 is corresponding to the external magnetic field in the X-axis direction, and through the curve 17, the gain coefficient $Axx=(B_{x+}-B_{x-})/Bx=(-6+6)/10=0$ can be obtained.

Figure 8:
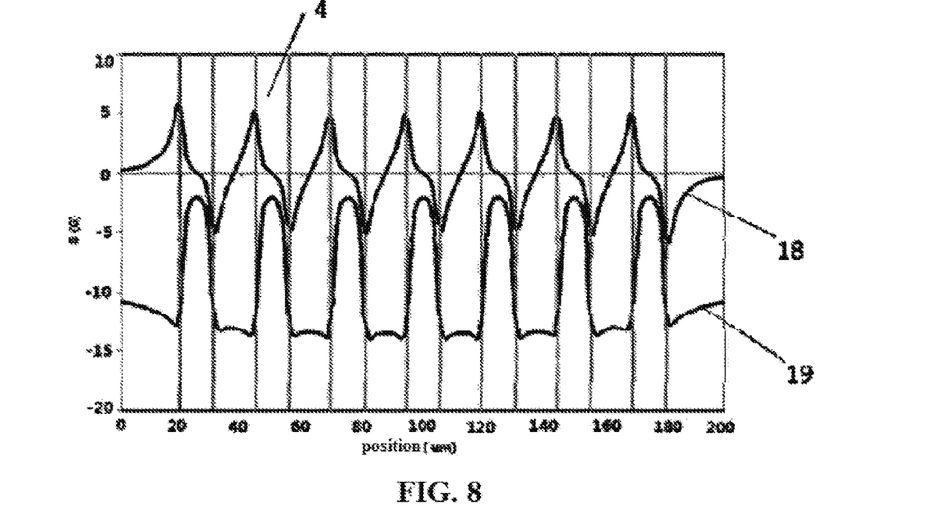
FIG. 8 shows curves of the measured magnetic field components in the X- and Z-axis directions versus the positions of magnetoresistive sensing elements when the space between the two adjacent flux guides is 15 microns.

FIG. 8 show relation curves 18 and 19 of the detected magnetic field components in the Z- and X-axis directions versus the positions of magnetoresistive sensing elements when the space between the adjacent two flux guides is 15 microns. The applied external magnetic field is still 10 Gauss. From the curves 18 and 19, the gain coefficient $Axz=(B_{x+}-B_{x-})/Bz=(4+4)/10=0.8$, $Axx=(B_{x+}-Bx_{-})/Bx=(-2.5+2.5)/10=0$ can be obtained.

It can be known from the result obtained by comparing FIG. 7 and FIG. 8 that, the gain coefficient Axz is associated with the space between the adjacent two flux guides. The greater the space is, the greater the Axz value is. Therefore, the space is generally designed to be greater than twice of the width of the flux guides 4.

The above discussed is a case where the bridge is a full bridge, because the half bridge and the Quasi bridge have the same working principle as the full bridge, thus being not repeated in detail herein, the conclusion obtained above is also applicable to the single-chip Z-axis linear magnetoresistive sensor having the half-bridge or Quasi-bridge structure. The above is merely preferred embodiments of the present invention, and is not intended to limit the present invention, and for those skilled in the art, the present invention may have various changes and variations. Any modification, equivalent replacement, improvement, and the like made within the spirit and principle of the present invention shall fall in the protection scope of the present invention.

The invention claimed is:

1. A single-chip Z-axis linear magnetoresistive sensor for sensing Z-axis magnetic fields, the magnetoresistive sensor comprising:
   a substrate having a surface in a plane defined by an X axis and a Y axis orthogonal to the X axis, wherein the Z-axis direction is orthogonal to both the X axis and the Y axis;
   a bridge on the substrate, the bridge including alternately arranged push arms and pull arms electrically connected to each other;
   each of the push arms and the pull arms including at least one magnetoresistive sensing element configured to detect X-axis magnetic field components;
   a flux guide set including at least one flux guide, wherein the flex guide set is operably positioned over the plane with respect to an entire length of each of the push arms and the pull arms to entirely cover the push arms and pull arms of the bridge and distort Z-axis magnetic fields into X-axis magnetic field components detectable by the magnetoresistive sensing elements, each of the at least one sensing element being on the substrate surface, each of the flux guides being separated a distance away from the surface of the substrate such that a lower surface of each of the flux guides is further away from the surface of the substrate than the sensing elements and each of the at least one flux guide in the flux guide set includes a long axis parallel to the Y axis and a short axis parallel to the X axis,
   wherein the magnetoresistive sensing elements are GMR or TMR sensing elements, and pinning layers of the GMR or the TMR sensing elements have the same magnetization direction and when no external magnetic field is provided, the magnetization direction of a ferromagnetic free layer of the magnetoresistive sensing elements is parallel to the Y axis, and the magnetization direction of the pinning layer is parallel to the X axis.

2. The single-chip Z-axis linear magnetoresistive sensor of claim 1, wherein a ratio between length and width of the magnetoresistive sensing elements is greater than 1.

3. The single-chip Z-axis linear magnetoresistive sensor of claim 1, wherein the magnetization direction of the ferromagnetic free layer of the magnetoresistive sensing elements is aligned parallel to the Y axis by permanent magnet bias, double exchange bias, shape anisotropy, or a combination of at least two of permanent magnet bias, double exchange bias, or shape anisotropy.

4. The single-chip Z-axis linear magnetoresistive sensor of claim 3, wherein, the magnetization direction of the pinning layer is to be parallel to the X axis, and the magnetization direction of the ferromagnetic free layer is aligned parallel to the Y axis through the use of the shape anisotropy, and the ratio between length and width of the magnetoresistive sensing elements is greater than 3.

5. The single-chip Z-axis linear magnetoresistive sensor of claim 1, wherein, the push arms and the pull arms have the same number of magnetoresistive sensing elements, and a long axis of the magnetoresistive sensing elements is parallel to the Y axis.

6. The single-chip Z-axis linear magnetoresistive sensor of claim 1, wherein the bridge is a half bridge, a full bridge, or a quasi bridge.

7. The single-chip Z-axis linear magnetoresistive sensor of claim 1, wherein, the flux guides have a length Ly that is greater than a width Lx, and is also greater than the thickness Lz, and the flux guides are arranged in an array wherein the space S between two adjacent flux guides is not less than the width Lx, and the material of the flux guides is a soft ferromagnetic alloy, which contains one or several elements of Ni, Fe, Co, and Al.

8. The single-chip Z-axis linear magnetoresistive sensor of claim 7, wherein, the space S between the two adjacent flux guides ranges from 2 Lx to 3 Lx.

9. The single-chip Z-axis linear magnetoresistive sensor of claim 1, wherein the bridge is connected to a semiconductor packaging lead frame via a wire bond, and encapsulated in plastic to form a standard semiconductor package.

10. The single-chip Z-axis linear magnetoresistive sensor of claim 9, wherein, the semiconductor packaging method includes wire bonding, flip chip, ball grid array (BGA) packaging, wafer level packaging (WLP), or chip on board (COB) packaging.

11. The single-chip Z-axis linear magnetoresistive sensor of claim 1, wherein the substrate comprises an integrated circuit electrically connected to the bridge.

12. The single-chip Z-axis linear magnetoresistive sensor of claim 1, wherein each of the flux guides is directly over its respective push arm and pull arm.

13. The single-chip Z-axis linear magnetoresistive sensor of claim 1, wherein, the magnetoresistive sensing elements are located at two sides outside of the lower part with respect to the edge of the flux guides.

14. The single-chip Z-axis linear magnetoresistive sensor of claim 1, wherein, the magnetoresistive sensing elements are located at any position between ⅓ and ⅔ of the distance from the edge to the central line of the flux guides, including the ⅓ and ⅔ points.

15. The single-chip Z-axis linear magnetoresistive sensor of claim 1, wherein, the magnetoresistive sensing elements are moved to approach the lower edge of the flux guides, or the thickness Lz of the flux guides is increased, or the width Lx of the flux guides is reduced, so as to enhance the sensitivity of the single-chip Z-axis linear magnetoresistive sensor.

16. The single-chip Z-axis linear magnetoresistive sensor of claim 1, wherein the magnetoresistive sensing elements are GMR or TMR sensing elements, and pinning layers of the GMR or the TMR sensing elements have the same magnetization direction.

17. The single-chip Z-axis linear magnetoresistive sensor of claim 1, wherein, each of the flux guides have a length Ly that is greater than a width Lx, and is also greater than the thickness Lz, the space S between two adjacent flux guides is not less than the width Lx, and the material of the flux guides is a soft ferromagnetic alloy, which contains at least one of Ni, Fe, Co, or Al.

18. A single-chip Z-axis linear magnetoresistive sensor for sensing Z-axis magnetic fields, the magnetoresistive sensor comprising:
   a substrate having a surface in a plane defined by an X axis and a Y axis orthogonal to the X axis, wherein the Z-axis direction is orthogonal to both the X axis and the Y;
   a flux guide set over the substrate, the flux guide set include at least two parallel flux guides, each of the at least two flux guides having a length greater than a width; and
   a bridge on the substrate, the bridge including push arms and pull arms electrically connected to each other, wherein the flux guide set entirely covers the push arms and pull arms of the bridge, and wherein each of the push arms and each of the pulls arms include at least one magnetoresistive sensing element configured to detect X-axis magnetic field components, and each of the at least two parallel flux guides is operably located proximate to and over an entire length of a respective one of the push arms and an entire length of a respective one of the pull arms to distort Z-axis magnetic fields into X-axis magnetic field components detectable by the magnetoresistive sensing elements.

* * * * *

UNITED STATES PATENT AND TRADEMARK OFFICE
CERTIFICATE OF CORRECTION

PATENT NO. : 10,126,378 B2
APPLICATION NO. : 14/917784
DATED : November 13, 2018
INVENTOR(S) : James Geza Deak Page 1 of 1

It is certified that error appears in the above-identified patent and that said Letters Patent is hereby corrected as shown below:

On the Title Page

Item (71), in "Applicant", in Column 1, Line 2, after "Zhangjiagang", insert --, Jiangsu--

Item (72), in "Inventor", in Column 1, Line 1, after "Zhangjiagang", insert --, Jiangsu--

In the Claims

In Column 10, Line 19, in Claim 18, delete "Y;" and insert --Y axis;-- therefor

In Column 10, Line 28, in Claim 18, delete "pulls" and insert --pull-- therefor

Signed and Sealed this
Eighth Day of December, 2020

Andrei Iancu
*Director of the United States Patent and Trademark Office*